March 22, 1960 E. G. ROKA ET AL 2,929,972

SEMI-CONDUCTOR DEVICES

Filed Jan. 21, 1954

*INVENTOR.*
EDWARD GEORGE ROKA
ASBJORN M. SEVERSON
*BY* George H Fisher
*ATTORNEY*

United States Patent Office 2,929,972
Patented Mar. 22, 1960

2,929,972

SEMI-CONDUCTOR DEVICES

Edward G. Roka and Asbjorn M. Severson, Minneapolis, Minn., assignors to Minneapolis-Honeywell Regulator Company, Minneapolis, Minn., a corporation of Delaware Application January 21, 1954, Serial No. 405,347

8 Claims. (Cl. 317—235)

The present invention relates to improvements in semi-conductor devices, and more particularly to improved high power semi-conductor assemblies including electrical current translating devices such as power transistors and the like.

In semi-conductor devices generally, the power output depends on the heat dissipating characteristics of the assembly. For example, if the heat dissipating characteristics of a given assembly are limited or low the power output of the semi-conductor device can not be great. In the design of conventional low power semi-conductor devices, heat dissipating does not present any particular problems, but in the design of relatively high power semi-conductor devices, such as power transistors, provision must be made for extraordinary heat dissipation in order that these devices may successfully operate at high power levels. Further, in the design of semi-conductor devices generally, hermetic sealing is important since it preserves the characteristics of the devices and thus provides for more dependable operation. The present invention provides an improved high power semi-conductor assembly, such as a power transistor device, having an ability to handle extraordinarily large amounts of power, having superior heat dissipating qualities, and which is also hermetically sealed.

Briefly, the device of the present invention includes a semi-conductor body having at least one relatively large area junction electrode which is alloyed or diffused into and extends outwardly from the semi-conductor body; and this electrode is in good thermal contact with a highly thermal conductive member of the assembly, such as the base mounting member. This base member is further adapted to be mounted on a chassis or other suitable heat-sink for conducting away heat which is generated during the operation of the semi-conductor device. In order to protect the heat sensitive portions of the semi-conductor body during the sealing step which generally involves conventional soldering or welding, provision is made for a thermal barrier between the area being sealed and the highly thermal conductive portion of the base member. This feature permits relatively high temperatures in the area being soldered or welded, while the heat sensitive portions of the semi-conductor body are kept relatively cool. The junction electrodes at which a substantial amount of heat is generated during operation are sensitive to high temperatures, and must be protected from excessive heat in order to preserve the device.

Therefore, it is an object of the present invention to provide a high power semi-conductor device, such as a power transistor, which is capable of operation at high power levels.

It is a further object of the present invention to provide a semi-conductor electrical assembly which has superior heat dissipating characteristics, and which is adapted to be hermetically sealed in such a manner that the heat sensitive portions of the semi-conductor body are protected against damage due to the excessive temperatures which are encountered in the area being sealed.

It is still a further object of the present invention to provide a semi-conductor assembly wherein the semi-conductor body is mounted in such a manner that the portion which, during operation thereof, generates a substantial amount of heat is in good thermal contact with the heat dissipating portion of the assembly.

These and other objects will become apparent on a more detailed study of the following specification and drawings, in which.

Figure 1:
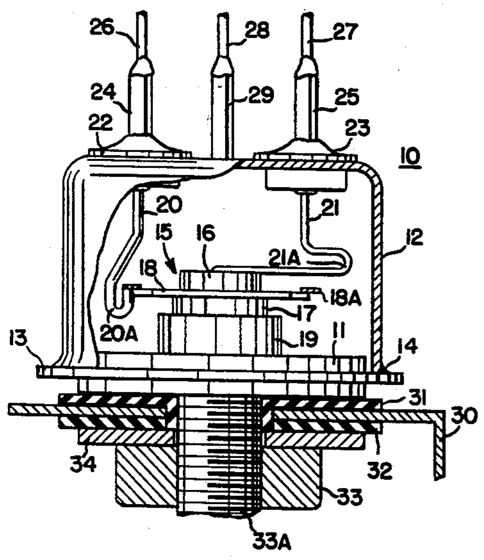
Figure 1 is a front elevational view, partially broken away, and partially in section, of a semi-conductor assembly in accordance with the present invention.
Figure 2:
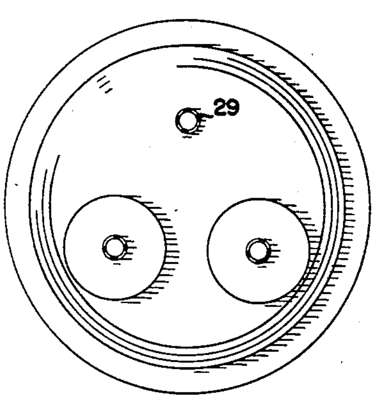
Figure 2 is a top plan view of the device of Figure 1.

In accordance with the preferred modification of the present invention, the semi-conductor assembly generally designated 10 comprises a base plate 11 and a cover member 12. A ring 13 having low thermal conductivity is attached to the periphery of base 11, and is adapted to receive the cover member 12. The cover 12 may be attached to the base, by soldering for example, as shown by the solder fillet 14. A semi-conductor unit 15, which for purposes of illustration herein is a junction transistor situated in the interior of the assembly, and includes alloyed junction electrode members 16 and 17 extending from the body 18. The semi-conductor body 18, may be germanium, silicon, or other suitable semi-conductor material, and the junction electrode members are a material such as indium, aluminum or other suitable material. A base ring 18A of a suitable metal such as nickel is provided around the outer peripheral surface of the semi-conductor body or wafer 18. This base ring preferably has relatively good electrical conductivity characteristics, and also has good mechanical strength. In operation, such a base ring provides for a low base resistance contact. In addition, such an electrode member is desirable from the standpoint of adding mechanical strength to the relatively thin and fragile semi-conductor wafer, thus protecting the wafer or crystal against fracture during fabrication, subsequent rough usage and handling, or when temperature gradients and resultant thermal strains are encountered in the crystal. A raised mounting block or pedestal 19 may optionally be included on the inner-face of the base 11, preferably being integral with the base 11. When utilized, this pedestal facilitates easier mounting of the junction electrode member 17 to the base 11. The junction is preferably attached to the base 11 by means of soldering with a suitable solder. Electrode lead wires 20 and 21 are attached to the transistor body at the emitter electrode 16 and the base electrode 18A, and are sealed into and electrically insulated from the cover member 12 by means of the seals 22 and 23. These leads are formed in such a manner that they will not be damaged or set up mechanical strains in the semi-conductor body due to thermal expansion thereof. This is accomplished for example, by means of the loops 20A and 21A. Leads 20 and 21 are protected from mechanical damage at the exterior of the cover 12 by the rigid tube sections 24 and 25 respectively, in which a connection is made to the exterior extending flexible leads 26 and 27. Another electrical connection is made to the assembly by means of the flexible lead 28 which is electrically connected to the tube 29. Tube 29 makes electrical contact with the cover member 12 which in turn is in good electrical contact with the base 11; thus an electrical connection is made to the junction electrode 17 which is itself in good electrical contact with the base member 11. In order to avoid shorting out the base member 11 to the chassis 30, insulating members or washers 31 and 32 may be disposed between the base member 11 and the chassis 30, and between the clamping nut 33 and the chassis 30 respectively. A thin washer 34 may be provided in order to protect the insulating washer 32 from excessive mechanical strain. The clamping nut 33 is threaded onto the mounting stud 33A which is secured to the base mounting member 11 for example, by brazing. The insulating members 31 and 32 are preferably made of a material which has good electrical insulating properties and which also has relatively good thermal conducting properties, such as thin layers of mica and the like.

The device of the present invention may, for example, comprise a junction transistor and may be prepared as follows, however it will be understood that these methods of preparation are given by way of illustration only, and there is no intention to limit the scope of the present invention to any specific method of preparation. Further, these devices are preferably prepared in accordance with the procedures set forth and described in the co-pending application of Van. W. Bearinger, Serial No. 383,201, filed September 30, 1953, entitled "Semi-Conductor Devices" and assigned to the same assignee as the present invention. Accordingly, a single-crystalline ingot of N-type germanium semi-conductor material having a resistivity of between 4 and 6 ohm-centimeters is prepared in accordance with conventional crystal growing processes and procedures. This ingot is divided or cut up into wafers or bodies having substantially the size and shape of the desired final crystal body. The wafers are then lapped to provide a more accurately dimensioned body. These ground wafers are then etched to clean the surface and improve the electrical properties thereof by means of a suitable etching solution, for example, the etching solution as described and set forth in Patent No. 2,619,414 to Heidenreich. A finished wafer having the dimensions of about 280 x 280 x 6 mils has been found satisfactory. To the peripheral portion of the finished crystal wafer there is provided a base electrode ring, this ring being attached to the outer peripheral portion of the wafer. This base electrode ring is preferably attached to the wafer body by means of a suitable relatively high melting solder and suitable non-corrosive flux. Emitter and collector electrodes, preferably the alloyed junction type, are then fabricated in the wafer body, and either electrode may be made first. These electrode members are preferably produced from an alloy comprising about 5% germanium and the remainder indium. The emitter junction electrode body is preferably disc shaped, having a diameter of about 130 mils, and being about 30 mils thick. This junction forming body is then placed in contact with substantially the center of the germanium wafer body, and held in contact therewith while the temperature is increased to between 975° F. and 1000° F., dropped rapidly to 850° F. and then cooled slowly to room temperature. Good results are obtained if the device is held at a temperature in excess of 850° F. for a period of about one minute. The collector electrode member is then diffused into the germanium wafer from the opposite face thereof in a similar manner. The collector has the same composition as the emitter, and is diffused into the semi-conductor body with substantially the same heating cycle; however it is slightly larger, being a disc having a diameter of about 150 mils with a thickness of about 30 mils. Electrode leads comprising, for example, nickel, are then soldered to the diffused junction emitter electrode and also to the base ring electrode. Next, the diffused junction collector electrode is mounted to the base mounting member of the device. The base mounting member, as previously described, preferably includes a mounting pedestal 19 which permits more convenient physical bonding between the collector electrode and the base mounting member 11. The collector electrode 17 being a substantially flat disc, provides a relatively large amount of area contact between the face of the collector electrode member and the base mounting member. This provides for good heat transfer between the collector and the base mounting member. A pre-assembled cap, having rigid tubes such as tubes 24, 25 and 29 attached thereto is then placed over the base mounting member, thus enclosing the transistor device. Lead electrodes which have previously been attached to the transistor body, such as lead electrodes 20 and 21 are threaded into the tubes 24 and 25, which are insulated from the cap 12, while the cap is being placed over the base 11.

Figure 3:
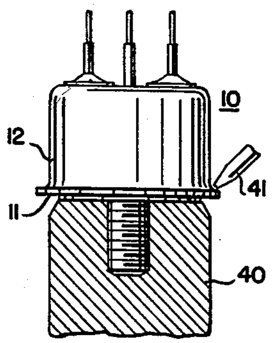
Figure 3 is a front elevational view, partially in section, showing one step in the fabrication of the device of the present invention.

Reference is now made to Figure 3 of the drawings wherein there is described a preferred method of sealing the cap to the base mounting member. The assembly 10 is mounted on a suitable heat sink member 40, and in good thermal contact therewith. The cap 12 may then be sealed to the base mounting member 11 by means of a suitable solder such as, for example 50 P6–50 Sn with heat supplied by the soldering iron 41. In the device of the present invention, the low thermal conductivity portion 13 of the base member 11 provides a poor thermal path between the peripheral portion which is being soldered and the high thermal conductivity central portion of the base 11. This rim 13 is preferably brazed to the base 11 and pre-timed before any assembly is begun. The electrode tubes which are electrically insulated from the cap, such as the tubes 24 and 25 are then sealed around the flexible leads 26 and 27 which have previously been soldered to the electrode leads 20 and 21. The unit is then flushed through tube 29 with a suitable non-oxidizing fill such as helium gas, heated to a temperature of 130° C. to remove volatile impurities, checked for leaks, filled and then sealed at the tube 29. As an alternative, the units may be vacuum sealed. While the non-insulated tube 29 is being sealed from the atmosphere, a flexible lead 28 in good electrical contact therewith is enclosed and sealed therein during the sealing operation. Transistor units produced in accordance with the above example have been operated successfully with a current carrying capacity of 1 ampere at 28 volts. The α (alpha) of these units is in a useful range.

Figure 4:
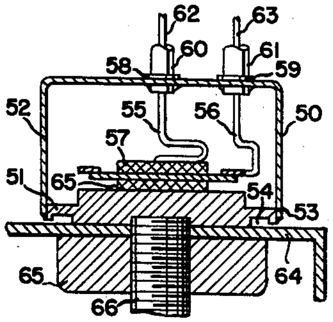
Figure 4 is a vertical sectional view of a slightly modified form of the present invention.
Figure 5:
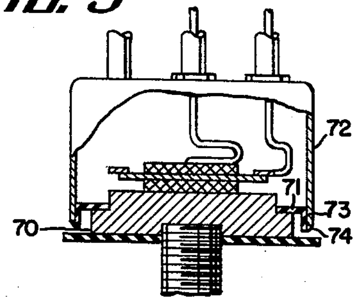
Figure 5 is a front elevational view of another modification of the present invention with a portion thereof shown in section.

Attention is now directed to the modifications of Figures 4 and 5 wherein there are described slight modifications of a semi-conductor assembly. In each of these modifications, the semi-conductor device may, for example, be produced in accordance with the procedures set forth and described with relation to Figure 1. In Figure 4, for example, a power assembly 50 is shown having a base mounting member 51 and a cap 52. The peripheral portion 53 of the base mounting member 51 is partially thermally isolated from the high thermal conductivity central portion by means of a thin annular groove 54 which presents an impedance to heat flow during the sealing operation, from the outer peripheral portion 53 to the central portion of the mounting member 51. In this device, two electrode leads 55 and 56 from the transistor 57 pass through the cover member 52, and are electrically insulated therefrom by the insulating seals 58 and 59 and extend into the rigid tubes 60 and 61. External electrode leads 62 and 63 pass through these tubes and make electrical contact with the transistor device 57 which is situated in good thermal contact with the base mounting member 51. The base mounting member, being a material of good electrical conductivity as well as good thermal conductivity serves as another electrode or electrical lead to the semi-conductor device through the chassis 64 to the semi-conductor electrode 65. This arrangement permits improved heat transfer through the base member 51 into the chassis 64 by elemination of the electrical insulator. The assembly is held in good physical contact with the chassis 46 by means of a clamping nut 65 on the mounting stud 66.

The modification of Figure 5 is identical in every respect with that shown in Figure 1 with the exception that a modified form of low thermal conductivity peripheral portion 71 is provided for the base mounting member 70. In this modificaiton, a modified form of sealing may be achieved, for example, by sweating the cap 72 onto the peripheral portion 71 as at 73. If desired, a solder fillet may be provided as at 74 for more efficient sealing between the cap 72 and the base member 70.

Many details of composition and procedure may be varied without departing from the principles of this invention. It is, therefore, not my purpose to limit the patent granted on this application otherwise than necessitated by the scope of the appended claims.

We claim as our invention:

1. A relatively high power transistor device comprising a junction transistor and a mounting therefor, said junction transistor having at least one relatively large externally extending diffused junction member, said mounting including a base member having a central portion with good thermal conducting characteristics and a peripheral portion which is substantially thermally isolated from said central portion and arranged to receive a cover member thereon, and means for positioning said base member in good thermal relationship with a chassis, said externally extending junction electrode being mounted in good thermal conducting relationship with said central portion for dissipating heat which is generated during operation of said power transistor.

2. A relatively high power transistor device comprising a junction transistor and a mounting therefor, said junction transistor having at least one relatively large externally extending diffused junction member, said mounting including a base member having a central portion with good thermal conducting characteristics and a peripheral portion which is substantially thermally isolated from said central portion and arranged to receive a cover member thereon, said junction member being supported on the central portion of said mounting and in direct thermal contact therewith throughout a substantial portion of the face of said junction member.

3. In a high power semi-conductor current translating device, in combination, a thermally and electrically conductive base mounting member having means for securing said base mounting member in good thermal conducting relationship to a heat dissipating chassis, a junction transistor having a pair of relatively large externally extending junction electrodes, one of said junction electrodes being attached to said base mounting member in good thermal and electrical conducting relationship therewith, an electrically conductive cover member secured on the periphery of said base mounting member in electrically condctive relationship therewith and enclosing said transistor, and an electrode lead in electrical contact with said cover and making electrical contact with the junction electrode which is attached to said base mounting member.

4. A relatively high power hermatically sealed transistor device comprising a junction transistor and a mounting member and cover member therefor, said junction transistor having at least one relatively large externally extending diffused junction member, said mounting member including a base member having a central portion with good thermal conducting characteristics and a peripheral portion which is substantially thermally isolated from said central portion, said peripheral portion being arranged to receive said cover member in sealed relationship thereto and to impede heat transfer to said mounting member during sealing, and said junction member being supported on the central portion of said mounting and in direct thermal contact therewith throughout a substantial portion of the face of said junction member.

5. A relatively high power hermetically sealed transistor device comprising a junction transistor and a mounting enclosure therefor, said junction transistor having at least one relatively large externally extending diffused junction member, said mounting enclosure including a base member having a central portion with good thermal conducting characteristics and a peripheral portion which substantially impedes thermal transfer to said central portion and a cover member mounted on said base along said peripheral portion and sealed thereto, and means for positioning said base member in good thermal relationship with a chassis, said externally extending junction electrode being mounted in good thermal conducting relationship with said central portion for dissipating heat which is generated during operation of said power transistor.

6. A relatively high power semi-conducting electrical current translating assembly comprising a semi-conducting electrical device and a mounting therefor, said electrical device having at least one relatively large externally disposed junction electrode, said mounting including a base mounting member having a central portion which is a material of relatively high thermal conductivity and a peripheral portion which is thermally isolated from said central portion and arranged to receive an electrode member thereon, and said externally disposed electrode being mounted in good thermal relationship to said central portion, and means for mounting said base mounting member in good thermal conducting relationship to a chassis.

7. In a semi-conducting asymmetrical current carrying device, in combination, a highly thermally conductive base mounting member forming a portion of an enclosure about an alloyed junction semi-conductor device having at least one relatively large alloyed junction electrode diffused into and extending from a body member, said alloyed junction electrode being in good thermal contact throughout a substantial portion of the area thereof with said base mounting member for dissipating heat generated during operation into said base mounting member, securing means for attaching said base mounting member to a chassis in good thermal conducting relationship therewith, cover means located on the periphery of said base mounting member and forming a hermetic enclosure therewith, and an electrode lead secured to said enclosure and making electrical contact with the junction electrode which is in contact with the base mounting member.

8. A relatively high power semiconducting electrical current translating assembly comprising a semiconducting electrical device and a mounting therefor, said electrical device having at least one relatively large externally disposed junction electrode, said mounting including a base mounting member having a central portion with high thermal conducting characteristics, a peripheral portion which is substantially thermally isolated from said central portion and arranged to receive a cover member thereon, and means for mounting said base mounting member in good thermal relationship onto a chassis, and said externally disposed electrode being mounted in good thermal relationship to the highly conductive central portion of said base mounting member.

References Cited in the file of this patent

UNITED STATES PATENTS

| | | |
|---|---|---|
| 2,353,461 | Hamann | July 11, 1944 |
| 2,538,593 | Rose | Jan. 16, 1951 |
| 2,665,399 | Lingel | Jan. 5, 1954 |
| 2,684,457 | Lingel | July 20, 1954 |
| 2,703,855 | Koch et al. | Mar. 8, 1955 |
| 2,725,505 | Webster et al. | Nov. 29, 1955 |
| 2,730,663 | Harty | Jan. 10, 1956 |
| 2,735,050 | Armstrong | Feb. 14, 1956 |
| 2,754,455 | Pankove | July 10, 1956 |
| 2,759,133 | Mueller | Aug. 14, 1956 |
| 2,809,332 | Sherwood | Oct. 8, 1957 |